(12) United States Patent
Kose et al.

(10) Patent No.: US 6,433,646 B2
(45) Date of Patent: Aug. 13, 2002

(54) MICROWAVE OSCILLATION CIRCUIT USING A DIELECTRIC RESONATOR

(75) Inventors: Yasushi Kose; Akihiro Ogisou, both of Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/800,305

(22) Filed: Mar. 2, 2001

(30) Foreign Application Priority Data

Mar. 3, 2000 (JP) ........................................ 2000-059068

(51) Int. Cl.[7] ................................................ H03B 5/18

(52) U.S. Cl. ........................ 331/99; 331/96; 331/117 D

(58) Field of Search ............................ 331/96, 99–102, 331/107 DP, 107 SL, 117 D

(56) References Cited

U.S. PATENT DOCUMENTS 4,707,669 A * 11/1987 Mekata et al. ................ 331/99

* cited by examiner

*Primary Examiner*—David Mis
(74) *Attorney, Agent, or Firm*—Katten Muchin Zavis Rosenman

(57) ABSTRACT

In a microwave oscillation circuit using a dielectric resonator, a bias resistor for determining a bias voltage supplied to a base terminal of a transistor is located in the neighborhood of a connection point between a feedback circuit side stub for the dielectric resonator and the base terminal of the transistor. The bias resistor has a resistance which basically determines a bias voltage supplied to the base terminal of the transistor and which is enough to make high the impedance of a bias voltage supplying circuit including the bias resistor, viewed at the input terminal of the transistor. Thus, a stable oscillation can be maintained independently of variation in a load impedance.

16 Claims, 2 Drawing Sheets

MICROWAVE OSCILLATION CIRCUIT USING A DIELECTRIC RESONATOR

BACKGROUND OF THE INVENTION

The present invention relates to a microwave oscillation circuit, and more specifically to a microwave oscillation circuit using a dielectric resonator.

Referring to FIG. 2, there is shown a simplified circuit layout pattern diagram of a microwave oscillation circuit of the type which uses a dielectric resonator and which is used at a low gain at an operating frequency. The shown microwave oscillation circuit includes a dielectric resonator 53 mounted on a not-shown dielectric substrate, a pair of stubs 51 and 52 each formed on the not-shown dielectric substrate and located adjacent to the dielectric resonator 53 to be coupled with the dielectric resonator 53 at a resonation frequency, a bipolar transistor or a field effect transistor 54 located on the not-shown dielectric substrate and electrically connected to the pair of stubs 51 and 52, respectively, and an oscillation output terminal 56 connected to the stub 52. The transistor 54 is driven with DC voltages supplied from a biasing circuit 55 including bias resistors.

The dielectric resonator 53 is formed of a solid body of dielectric material having a large dielectric constant sufficient to operate as a resonator. The stub 52 and the dielectric resonator 53 constitute a microwave resonating circuit, and the stub 51 and the dielectric resonator 53 constitutes a feedback circuit for the transistor 54.

The oscillation circuit is constituted of the transistor 54, the stubs 51 and 52 and the dielectric resonator 53. An oscillation signal generated in the oscillation circuit thus formed is picked out from the oscillation output terminal 56. Therefore, the transistor 54, the stubs 51 and 52, the dielectric resonator 53, and the oscillation output terminal 56 constitutes a high frequency circuit (microwave circuit).

As mentioned above, the transistor 54 is formed of either a bipolar transistor or a field effect transistor. When the transistor 54 is formed of the bipolar transistor, an emitter terminal of the bipolar transistor is connected to ground. A base terminal and a collector terminal of the bipolar transistor are connected to the stub 51 and the stub 52, respectively. On the other hand, when the transistor 54 is formed of the field effect transistor, a source terminal of the field effect transistor is connected to ground. A gate terminal and a drain terminal of the field effect transistor are connected to the stub 51 and the stub 52, respectively. The biasing circuit 55 supplies necessary DC voltages to the base (or the gate) and the collector (or the drain) of the transistor 54, respectively, and therefore is constituted independently of the high frequency circuit as mentioned above.

For only convenience, the following description will be described under the assumption that the transistor 54 is formed of the bipolar transistor, but it should not be forgotten that as mentioned above, the transistor 54 can be formed of either a bipolar transistor or a field effect transistor.

In the above mentioned microwave oscillation circuit having the above mentioned construction, if the impedance of a load connected to the oscillation output terminal 56 varies, the impedance of the stub 52 correspondingly varies, with the result that the oscillation characteristics varies, and simultaneously, an operation stability at the side of the stub 51 becomes deteriorated. Specifically, when the impedance of the load varies, the oscillation output level becomes unstable, and in an extreme case, the oscillation stops.

Furthermore, since the oscillation circuit is of the feedback type, an isolation between the base and the collector of the transistor 54 (between the gate and the drain in the case of the field effect transistor) is not so good, so that variation on the output side is transferred to the base (or the gate), with the result that the unstability becomes large.

BRIEF SUMMARY OF THE INVENTION

Accordingly, it is an object of the present invention to provide a microwave oscillation circuit using a dielectric resonator, which has overcome the above mentioned problems of the prior art.

Another object of the present invention is to provide a microwave oscillation circuit using a dielectric resonator, capable of maintaining a stable oscillation independently of variation in a load impedance.

The above and other objects of the present invention are achieved in accordance with the present invention by a microwave oscillation circuit comprising a dielectric resonator located on a dielectric substrate, a first high frequency transmission line formed on the dielectric substrate and having one end coupled to the dielectric resonator at a resonation frequency, and a second high frequency transmission line formed on the dielectric substrate and having one end coupled to the dielectric resonator at the resonation frequency, and a transistor mounted on the dielectric substrate and having an input terminal connected to the other end of the first high frequency transmission line and an output terminal connected to the other end of the second high frequency transmission line, so that when the transistor is driven with a DC voltage, the transistor oscillates so that an oscillation output is outputted from the output terminal of the transistor, the microwave oscillation circuit further includes a bias resistor located in the neighborhood of a connection point between the other end of the first high frequency transmission line and the input terminal of the transistor, the bias resistor having a resistance which basically determines a bias voltage supplied to the input terminal of the transistor and which is enough to make high the impedance of a bias voltage supplying circuit including the bias resistor, viewed at the input terminal of the transistor.

With this arrangement, since the bias resistor for basically determining the bias voltage supplied to the input terminal of the transistor is located in the neighborhood of the connection point between the input terminal of the transistor and the other end of the first high frequency transmission line, although the microwave oscillation circuit behaves as a distributed parameter circuit, the impedance of the bias voltage supplying circuit viewed at the input terminal of the transistor becomes high by action of the resistance of the bias resistor. As the result, a high-frequency impedance of a microwave circuit at an input terminal side of the transistor is stabilized, and the amplitude modulation of the bias voltage supplied to the input terminal of the transistor, caused by the oscillation component, is avoided. Therefore, the oscillation stability is improved, and the oscillation output level are stabilized. Therefore, it is possible to completely avoid the stop of the oscillation caused by a variation in the impedance of the load.

The above and other objects, features and advantages of the present invention will be apparent from the following description of preferred embodiments of the invention with reference to the accompanying drawings.

DETAILED DESCRIPTION OF THE INVENTION

Figure 1:
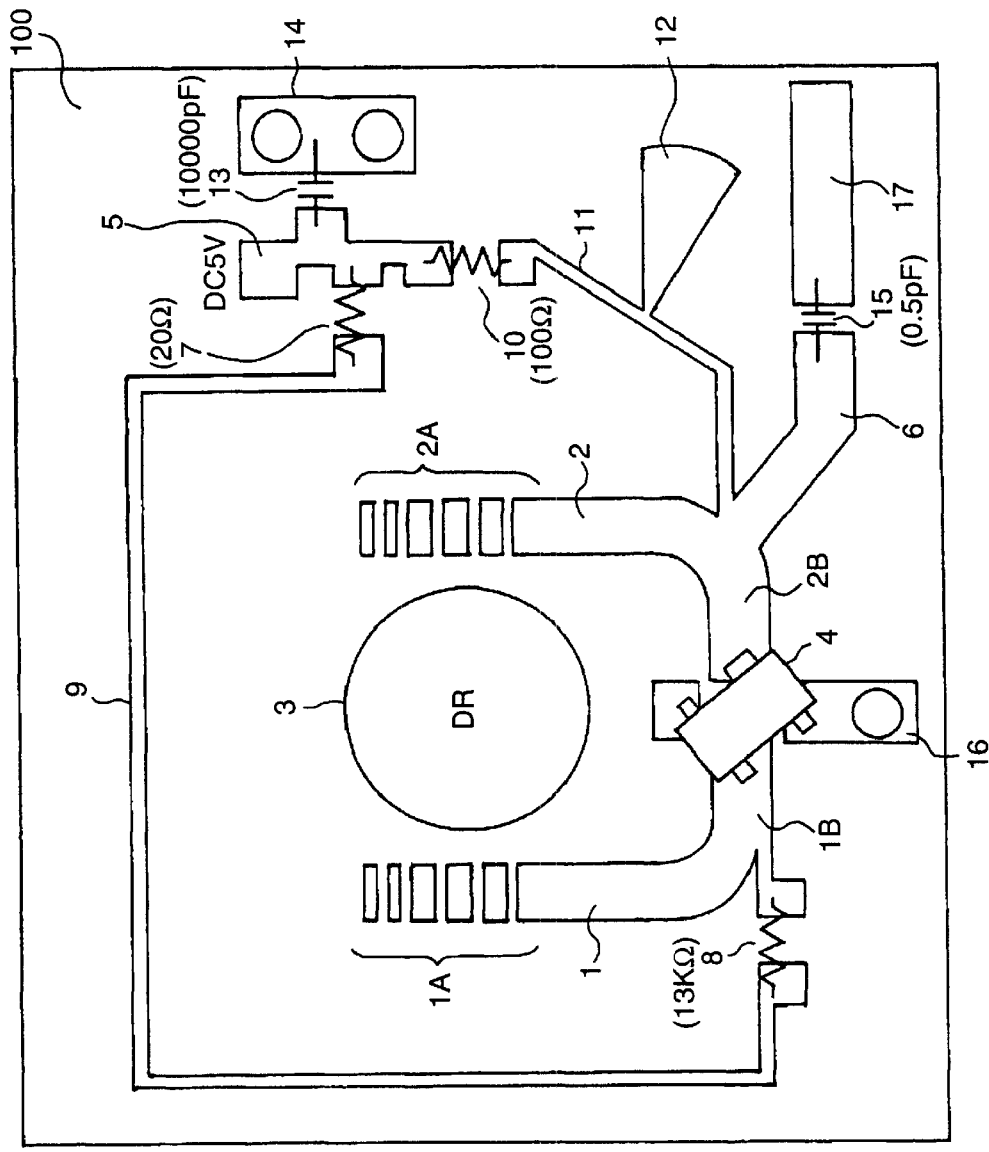
FIG. 1 is a circuit layout pattern diagram of one embodiment of the microwave oscillation circuit in accordance with the present invention of the type using a dielectric resonator.
Figure 2:
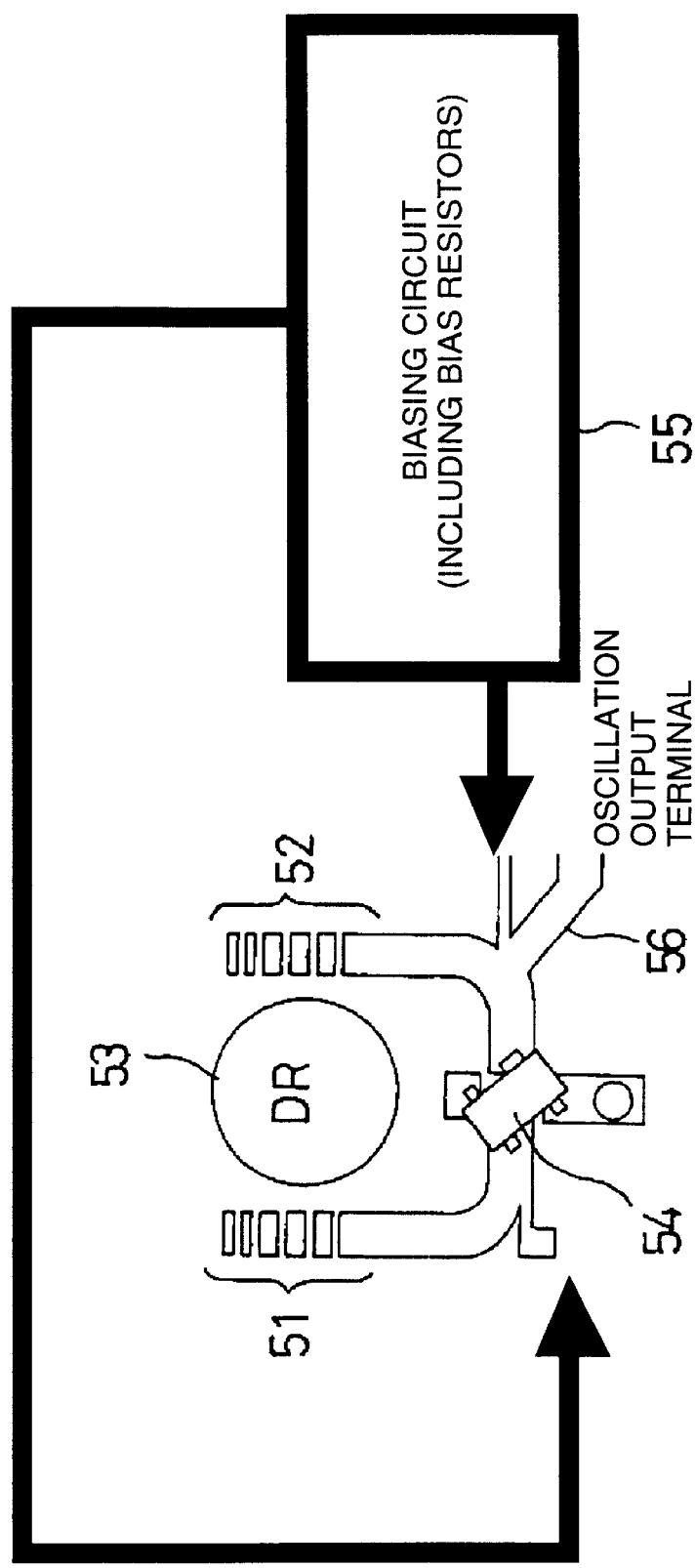
FIG. 2 is a simplified circuit layout pattern diagram of a conventional microwave oscillation circuit of the type using a dielectric resonator.

Referring to FIG. 1, there is shown a circuit layout pattern diagram showing one embodiment of the microwave oscillation circuit in accordance with the present invention, which is constituted by using a microstrip line.

In FIG. 1, the reference number 100 designates a dielectric substrate. The microwave oscillation circuit includes a stub (first high frequency transmission line) 1 and a stub (second high frequency transmission line) 2 formed on the dielectric substrate 100 each to form a microstrip line optimum to an oscillation frequency of the microwave oscillation circuit. A dielectric resonator 3 is located on the dielectric substrate 100 between one end 1A of the stub 1 and one end 2A of the stub 2, so that the dielectric resonator 3 is coupled with the stubs 1 and 2 at a resonation frequency $f_O$. The dielectric resonator 3 is formed of a solid body of dielectric material having a large dielectric constant sufficient to operate as a resonator. A transistor 4, which is a discrete component and which is constituted of either a bipolar transistor or a field effect transistor, is located on the dielectric substrate 100 to be electrically connected to the other end 1B of the stub 1 and the other end 2B of the stub 2, respectively. In this construction, the one end 1A of the stub 1 and the one end 2A of the stub 2 have an infinite impedance.

For only convenience of explanation, the following description will be made under the assumption that the transistor 4 is constituted of a bipolar transistor. In the case that the transistor 4 is constituted of a field effect transistor, the following description should be read while replacing a base, a collector and an emitter by a gate, a drain and a source, respectively, as will be apparent to persons skilled in the art. Furthermore, it should be understood in the specification that, the term "an input terminal of the transistor" means a base terminal of the bipolar transistor in an emitter grounded transistor circuit, and a gate terminal of the field effect transistor in a source grounded transistor circuit, and the term "an output terminal of the transistor" means a collector terminal of the bipolar transistor in the emitter grounded transistor circuit, and a drain terminal of the field effect transistor in the source grounded transistor circuit.

A base terminal of the transistor 4 is electrically connected to the other end 1B of the stub 1, and a collector terminal of the transistor 4 is electrically connected to the other end 2B of the stub 2. An emitter terminal of the transistor 4 is electrically connected to a grounded conductor pattern 16 laid out on the dielectric substrate 100, in the proximity of the other end of each of the stubs 1 and 2.

Furthermore, oscillation outputting conductor patterns 6 and 17 are formed on the dielectric substrate 100 to form a microstrip line optimum to the oscillation frequency of the microwave oscillation circuit. The oscillation outputting conductor pattern 6 extends from the other end 2B of the stub and 2. The oscillation outputting conductor pattern 17 extends toward an edge of the dielectric substrate 100 from a position slightly apart from an outer end of the oscillation outputting conductor pattern 6. An output load capacitor 15 is electrically connected between the outer end of the oscillation outputting conductor pattern 6 and an inner end of the oscillation outputting conductor pattern 17.

In the above mentioned construction, the stub 2 and the dielectric resonator 3 constitute a microwave resonating circuit, and the stub 1 and the dielectric resonator 3 constitutes a feedback circuit for the transistor 4. The stubs 1 and 2 and the dielectric resonator 3 functions as a positive feedback circuit for the transistor 4, so that the stubs 1 and 2, the dielectric resonator 3 and the transistor 4 constitute an oscillation circuit. An oscillation outputted generated in the oscillation circuit is picked up through the oscillation outputting conductor pattern 6, the output load capacitor 15 and the oscillation outputting conductor pattern 17.

The above mentioned construction constitutes a microwave circuit. Now, a DC voltage supplying circuit for driving the transistor 4 will be described.

A DC voltage supplying conductor pattern 5 is laid out on the dielectric substrate 100, and a base bias voltage supplying conductor pattern 9 is laid out on the dielectric substrate 100 to extend from a position slightly apart from the DC voltage supplying conductor pattern 5 to bypass the dielectric resonator 3 and to reach a position slightly apart from a connection point between the other end 1B of the stub 1 and the base terminal of the transistor 4. A fine-adjusting base bias resistor 7 is connected between the DC voltage supplying conductor pattern 5 and one end of the base bias voltage supplying conductor pattern 9, and a main base bias resistor 8 is connected between the other end of the base bias voltage supplying conductor pattern 9 and the stub 1 at a position in the neighborhood of the connection point between the other end of the stub 1 and the base of the transistor 4.

In addition, a collector voltage supplying conductor pattern 11 is laid out on the dielectric substrate 100 to extend from another position slightly apart from the DC voltage supplying conductor pattern 5 to reach a connection point between the stub 2 and the oscillation outputting conductor pattern 6. A collector bias resistor 10 is connected between the DC voltage supplying conductor pattern 5 and one end of the collector voltage supplying conductor pattern 11. An open stub 12 is formed on the dielectric substrate 100 and a base end of the open stub 12 is connected to the collector voltage supplying conductor pattern 11. This open stub 12 can be either in the form of a sector as shown in FIG. 1 or in the form of an elongated rectangle.

Furthermore, another grounded conductor pattern 14 is laid out on the dielectric substrate 100 near to the DC voltage supplying conductor pattern 5. A low frequency parasite oscillation preventing capacitor 13 is electrically connected between the DC voltage supplying conductor pattern 5 and the grounded conductor pattern 14.

In the above mentioned arrangement, for example, DC 5V is supplied to the DC voltage supplying conductor pattern 5. The base bias resistors 7 and 8 and the base bias voltage supplying conductor pattern 9 determines a base bias voltage which is applied to the base of the transistor 4 so as to determine a collector current of the transistor 4. Here, assuming that the base bias resistor 7 has the resistance Rb2, the base bias resistor 8 has the resistance Rb1, and the resistance of the base bias voltage supplying conductor pattern 9 is negligible, it is in an ordinary case that the resistance {Rb1+Rb2} is on the order of 5 kΩ to 15 kΩ. In addition, the resistors 7, 8 and 10 and the capacitors 13 and 15 are ordinarily constituted of chip components. In this case, a coarse resistance adjustment is carried out by the base bias resistor 8 and a fine resistance adjustment is carried out by the base bias resistor 7.

The base bias resistor 8 is located in the extreme neighborhood of a connection point between the other end of the stub 1 and the base of the transistor 4. Ordinarily, the base bias voltage supplying conductor pattern 9 has a conductor width of about 50 μm to 100 μm, although it is in now way limited to these values.

The collector bias resistor 10 and the collector voltage supplying conductor pattern 11 constitutes a collector voltage supplying circuit for the transistor 4. The open stub 12 connected to the collector voltage supplying conductor pattern 11 functions as a capacitor to cause the collector voltage supplying circuit to have a high impedance when it is viewed from the microwave circuit (namely, when it is viewed from the stub 2), so that the oscillation output is prevented from leaking to the DC voltage supplying conductor pattern 5 from the microwave circuit.

In the microwave circuit, since a substantial current flows through the collector of the transistor, a resistor having a high resistance cannot be inserted for realizing a high impedance in the collector voltage supplying circuit. In this case, the open stub is often connected to a position apart from a connection point between a microwave circuit line and a collector voltage supplying line by λg/4 (where λg is a wavelength at the dielectric substrate of the resonation frequency), in order to cause the collector voltage supplying circuit to have a high impedance when it is viewed from the microwave circuit. However, since the open stub itself is well known to persons skilled in the art, a further description will be omitted. On the other hand, the open stub 12 is not necessarily indispensable, if it is possible to cause the collector voltage supplying circuit to have a high impedance by any other means, or it is not necessary to cause the collector voltage supplying circuit to have a high impedance.

The capacitor 13 is provided for preventing a parasite oscillation at a low frequency. The capacitor 15 is provided for blocking a DC component while allowing passage of the oscillation output.

In operation, if for example DC 5V is applied to the DC voltage supplying conductor pattern 5, the transistor 4 is driven with an appropriate base bias and an appropriate collector voltage. As a result, the shown circuit oscillates by action of the resonating circuit composed of the stub 2 and the dielectric resonator 3 and the feedback circuit composed of the dielectric resonator 3 and the stub 1. In this oscillation operation, the base bias voltage and the collector voltage of the transistor vibrate by the oscillation power, and are greatly influenced by the impedance of a peripheral circuit connected to the oscillation circuit.

In order to obtain a stable oscillation in the microwave oscillation circuit, it is necessary that the voltages applied to the transistor 4 are stable without being influenced by the high frequency power, and the impedance of the peripheral circuit is stable.

As mentioned above, the oscillation output is picked up from the collector of the transistor. However, the stability against to a variation in a load impedance can be realized by constituting a L-type or π-type attenuator at the output terminal of the oscillation circuit.

On the other hand, since the base side of the transistor 4 has no external interface, it is necessary that any means for obtaining a stable oscillation operation is provided in an oscillation circuit block, namely, on the dielectric substrate 100. On the other hand, it is difficult to stabilize the impedance of the feedback circuit by only the infinite impedance of the free end 1A of the stub 1, because the base bias voltage supplying conductor pattern 9 connected to the stub 1 behaves as a distributed parameter circuit in a microwave band. In the shown embodiment, the base bias resistor 8 connected to the stub 1 is located in the neighborhood of the connection point between the other end of the stub 1 and the base terminal of the transistor 4. Since the base bias resistor 8 has the resistance on the order of 10 kΩ, the impedance of the base bias voltage supplying circuit becomes sufficiently high when it is viewed from the oscillation circuit (namely, the microwave circuit) which is constituted to have the characteristic impedance of for example 50Ω. As the result, a high-frequency impedance of a microwave circuit at a base terminal side of the transistor (namely, at a side of the stub 1) is stabilized, and the amplitude modulation of the base bias voltage caused by the oscillation component is avoided. Therefore, the oscillation stability is improved, and the oscillation output level are stabilized. Therefore, it is possible to completely avoid the stop of the oscillation caused by a variation in the impedance of the load.

Here, it is to be noted that in a microwave band, particularly in a frequency band of not less than 2 GHz, the circuit behaves as a distributed parameter circuit. Therefore, when the base bias resistor is connected, the impedance of the base bias voltage supplying circuit viewed from the oscillation circuit is different dependently upon the position to which the base bias resistor is connected. In the present invention, therefore, in order to make high the impedance of the base bias voltage supplying circuit viewed from the oscillation circuit, it is indispensable to locate the base bias resistor 8 in the neighborhood of the connection point between the other end of the stub 1 and the base terminal of the transistor 4. Preferably, the base bias resistor 8 is located at a position within the distance of not greater than λg/6 from the connection point between the other end of the stub 1 and the base terminal of the transistor 4.

Incidentally, in the shown embodiment, even if the load impedance is infinite so that a total reflection is realized, the oscillation never stops for all phases. In addition, even in the worst load varying condition of the total reflection and the all-phase, it is possible to improve the variation width of the oscillation output by 2 dB to 3 dB, without increasing the number of components included in the whole oscillation circuit.

Accordingly, the shown embodiment can elevate the oscillation stability against the variation in the load impedance without increasing the number of components.

Furthermore, since the base bias resistor 8 for basically determining the base bias voltage is located in the neighborhood of the connection point between the stub (constituting the feedback circuit) and the base terminal of the transistor, the amplitude modulation of the base bias voltage caused by the oscillation component is avoided, with the result that it is possible to minimize the oscillation output level against the variation in the output load impedance.

In the above mentioned embodiment, the fine-adjusting base bias resistor 7 can be omitted, since the base bias voltage is fundamentally determined by the base bias resistor 8, if the fine-adjusting is not necessary, or if not only the coarse adjustment but also the fine-adjusting can be realized by only the base bias resistor 8. As mentioned hereinbefore, however, the base bias resistors 7 and 8 are formed of chip resistors in many practical cases. Since the resistance of the chip resistors is actually discrete, it is preferable to combine the fine-adjusting base bias resistor 7 having a small resistance and the base bias resistor 8 having a large resistance on the order of 10 kΩ, in order to obtain a desired base bias voltage.

In addition, the position of the fine-adjusting base bias resistor 7 is in no way limited to the position near to the DC voltage supplying conductor pattern 5. Even if fine-adjusting base bias resistor 7 is located at any position along the base bias voltage supplying conductor pattern 9 from the DC voltage supplying conductor pattern 5 to the base bias resistor 8, the advantage of the present invention can be obtained with no deterioration.

The invention has thus been shown and described with reference to the specific embodiments. However, it should be noted that the present invention is in no way limited to the details of the illustrated structures but changes and modifications may be made within the scope of the appended claims.

What is claimed is:

1. A microwave oscillation circuit comprising a dielectric resonator located on a dielectric substrate, a first high frequency transmission line formed on said dielectric substrate and having one end coupled to said dielectric resonator at a resonation frequency, and a second high frequency transmission line formed on said dielectric substrate and having one end coupled to said dielectric resonator at said resonation frequency, and a transistor mounted on said dielectric substrate and having an input terminal connected to the other end of said first high frequency transmission line and an output terminal connected to the other end of said second high frequency transmission line, so that when said transistor is driven with a DC voltage, said transistor oscillates so that an oscillation output is outputted from said output terminal of said transistor, the microwave oscillation circuit further includes a bias resistor located in the neighborhood of a connection point between said other end of said first high frequency transmission line and said input terminal of said transistor, said bias resistor having a resistance which basically determines a bias voltage supplied to said input terminal of said transistor and which is enough to make high the impedance of a bias voltage supplying circuit including said bias resistor, viewed at said input terminal of said transistor.

2. A microwave oscillation circuit claimed in claim 1, wherein said bias resistor is located in a range of a distance of not greater than $\lambda g/6$ from said connection point between said other end of said first high frequency transmission line and said input terminal of said transistor, where $\lambda g$ is a wavelength at said dielectric substrate of said resonation frequency.

3. A microwave oscillation circuit claimed in claim 2, wherein said transistor is a bipolar transistor, so that said input terminal of said transistor is a base terminal of the bipolar transistor, and said output terminal of said transistor is a collector terminal of the bipolar transistor, an emitter terminal of the bipolar transistor being connected to ground.

4. A microwave oscillation circuit claimed in claim 2, wherein said transistor is a field effect transistor, so that said input terminal of said transistor is a gate terminal of the field effect transistor, and said output terminal of said transistor is a drain terminal of the field effect transistor, a source terminal of the bipolar field effect being connected to ground.

5. A microwave oscillation circuit claimed in claim 2, further including a DC voltage supplying conductor pattern laid out on said dielectric substrate, a fine-adjusting bias resistor located on said dielectric substrate and having one end connected to said DC voltage supplying conductor pattern, a bias voltage supplying conductor pattern laid out on said dielectric substrate and having one end connected to the other end of said fine-adjusting bias resistor, said bias voltage supplying conductor pattern extending near to said input terminal of said transistor, said bias resistor having one end connected to the other end of said bias voltage supplying conductor pattern and the other end connected to said first high frequency transmission line in the neighborhood of said connection point between said other end of said first high frequency transmission line and said input terminal of said transistor.

6. A microwave oscillation circuit claimed in claim 5, further including a second bias resistor located near to said DC voltage supplying conductor pattern and having one end connected to said DC voltage supplying conductor pattern, and a drive voltage supplying conductor pattern laid out on said dielectric substrate and having one end connected to the other end said second bias resistor, said drive voltage supplying conductor pattern extending to a connection point between said other end of said second high frequency transmission line and said output terminal of said transistor, for supplying a drive voltage to said output terminal of said transistor.

7. A microwave oscillation circuit claimed in claim 6, further including an open stub formed on said dielectric substrate to extend from said drive voltage supplying conductor pattern and to function as a capacitor for making high the impedance of a drive voltage supplying circuit including said drive voltage supplying conductor pattern, viewed from said second high frequency transmission line.

8. A microwave oscillation circuit claimed in claim 2, further including a DC voltage supplying conductor pattern laid out on said dielectric substrate, a second bias resistor located near to said DC voltage supplying conductor pattern and having one end connected to said DC voltage supplying conductor pattern, and a drive voltage supplying conductor pattern laid out on said dielectric substrate and having one end connected to the other end said second bias resistor, said drive voltage supplying conductor pattern extending to a connection point between said other end of said second high frequency transmission line and said output terminal of said transistor, for supplying a drive voltage to said output terminal of said transistor.

9. A microwave oscillation circuit claimed in claim 8, further including an open stub formed on said dielectric substrate to extend from said drive voltage supplying conductor pattern and to function as a capacitor for making high the impedance of a drive voltage supplying circuit including said drive voltage supplying conductor pattern, viewed from said second high frequency transmission line.

10. A microwave oscillation circuit claimed in claim 1, wherein said transistor is a bipolar transistor, so that said input terminal of said transistor is a base terminal of the bipolar transistor, and said output terminal of said transistor is a collector terminal of the bipolar transistor, an emitter terminal of the bipolar transistor being connected to ground.

11. A microwave oscillation circuit claimed in claim 1, wherein said transistor is a field effect transistor, so that said input terminal of said transistor is a gate terminal of the field effect transistor, and said output terminal of said transistor is a drain terminal of the field effect transistor, a source terminal of the bipolar field effect being connected to ground.

12. A microwave oscillation circuit claimed in claim 1, further including a DC voltage supplying conductor pattern laid out on said dielectric substrate, a fine-adjusting bias resistor located on said dielectric substrate and having one end connected to said DC voltage supplying conductor pattern, a bias voltage supplying conductor pattern laid out on said dielectric substrate and having one end connected to the other end of said fine-adjusting bias resistor, said bias voltage supplying conductor pattern extending near to said input terminal of said transistor, said bias resistor having one end connected to the other end of said bias voltage supplying conductor pattern and the other end connected to said first high frequency transmission line in the neighborhood of said connection point between said other end of said first high frequency transmission line and said input terminal of said transistor.

13. A microwave oscillation circuit claimed in claim 12, further including a second bias resistor located near to said DC voltage supplying conductor pattern and having one end connected to said DC voltage supplying conductor pattern, and a drive voltage supplying conductor pattern laid out on said dielectric substrate and having one end connected to the other end said second bias resistor, said drive voltage supplying conductor pattern extending to a connection point between said other end of said second high frequency transmission line and said output terminal of said transistor, for supplying a drive voltage to said output terminal of said transistor.

14. A microwave oscillation circuit claimed in claim 13, further including an open stub formed on said dielectric substrate to extend from said drive voltage supplying conductor pattern and to function as a capacitor for making high the impedance of a drive voltage supplying circuit including said drive voltage supplying conductor pattern, viewed from said second high frequency transmission line.

15. A microwave oscillation circuit claimed in claim 1, further including a DC voltage supplying conductor pattern laid out on said dielectric substrate, a second bias resistor located near to said DC voltage supplying conductor pattern and having one end connected to said DC voltage supplying conductor pattern, and a drive voltage supplying conductor pattern laid out on said dielectric substrate and having one end connected to the other end said second bias resistor, said drive voltage supplying conductor pattern extending to a connection point between said other end of said second high frequency transmission line and said output terminal of said transistor, for supplying a drive voltage to said output terminal of said transistor.

16. A microwave oscillation circuit claimed in claim 15, further including an open stub formed on said dielectric substrate to extend from said drive voltage supplying conductor pattern and to function as a capacitor for making high the impedance of a drive voltage supplying circuit including said drive voltage supplying conductor pattern, viewed from said second high frequency transmission line.

* * * * *